(12) United States Patent
Moronuki et al.

(10) Patent No.: US 7,955,691 B2
(45) Date of Patent: Jun. 7, 2011

(54) HARD AMORPHOUS CARBON FILM

(75) Inventors: Masaki Moronuki, Kashiwazaki (JP);
Takashi Matsui, Kumagaya (JP);
Yoshiharu Utsumi, Kyoto (JP);
Hisanori Ohara, Maebashi (JP)

(73) Assignees: Kabushiki Kaisha Riken, Tokyo (JP);
Nippon ITF, Inc., Kyoto (JP)

( * ) Notice: Subject to any disclaimer, the term of this patent is extended or adjusted under 35 U.S.C. 154(b) by 397 days.

(21) Appl. No.: 12/086,737

(22) PCT Filed: Nov. 28, 2006

(86) PCT No.: PCT/JP2006/323645
§ 371 (c)(1),
(2), (4) Date: Jun. 18, 2008

(87) PCT Pub. No.: WO2007/072658
PCT Pub. Date: Jun. 28, 2007

(65) Prior Publication Data
US 2009/0011225 A1  Jan. 8, 2009

(30) Foreign Application Priority Data

Dec. 21, 2005  (JP) .............................. 2005-367528

(51) Int. Cl.
*B32B 9/00* (2006.01)
(52) U.S. Cl. ......... 428/216; 428/217; 428/336; 428/408
(58) Field of Classification Search .................. 428/216, 428/217, 336, 408
See application file for complete search history.

(56) References Cited

U.S. PATENT DOCUMENTS

| | | | | |
|---|---|---|---|---|
| 5,368,937 A | * | 11/1994 | Itoh ............................ | 428/408 |
| 6,110,329 A | | 8/2000 | Holleck et al. | |
| 6,638,608 B1 | * | 10/2003 | Gui et al. ..................... | 428/336 |
| 6,716,540 B2 | * | 4/2004 | Kohara et al. ................. | 428/408 |

FOREIGN PATENT DOCUMENTS

| | | |
|---|---|---|
| EP | 0 724 023 A1 | 7/1996 |
| JP | 63-262467 | 10/1988 |
| JP | 63-286334 | 11/1988 |
| JP | 63-286576 | 11/1988 |
| JP | 1-079371 | 3/1989 |
| JP | 1-294867 | 11/1989 |
| JP | 5117856 | 5/1993 |
| JP | 5202477 | 8/1993 |
| JP | 2000-128516 | 5/2000 |

(Continued)

OTHER PUBLICATIONS

Banzhof et al., "High Resolution TEM Investigations of Nanostructures in Hard Amorphous Carbon Films," Material Science Forum. vols. 287-288 pp. 243-246 (1998).
International Search Report corresponding to International Application No. PCT/JP2006/323645 dated Jan. 16, 2007.

(Continued)

*Primary Examiner* — Archene Turner
(74) *Attorney, Agent, or Firm* — Jenkins, Wilson, Taylor & Hunt, P.A.

(57) ABSTRACT

An amorphous hard carbon film comprising a first amorphous carbon layer substantially consists only of carbon formed on a substrate surface and a second amorphous carbon layer substantially consists only of carbon formed on the surface of the first amorphous carbon layer, wherein the transmission electron microscope image of the first amorphous carbon layer is brighter than that of the second amorphous carbon layer when the cross section is observed.

5 Claims, 3 Drawing Sheets

FOREIGN PATENT DOCUMENTS

| | | |
|---|---|---|
| JP | 2001-192206 | 7/2001 |
| JP | 2002-256415 | 9/2002 |
| JP | 2002-322555 | 11/2002 |
| JP | 2003-171758 | 6/2003 |
| WO | WO2007/072658 | 6/2007 |

OTHER PUBLICATIONS

Extended European Search Report corresponding to European Patent Application No. 0683449.9-1215 dated Jun. 17, 2010.

* cited by examiner

100nm

HARD AMORPHOUS CARBON FILM

FIELD OF THE INVENTION

The present invention relates to a hard amorphous carbon film that is adapted for use in a slide member, particularly in an automotive parts and the like from which excellent reliability is demanded.

DESCRIPTION OF THE RELATED ART

Amorphous carbon is commonly referred to as diamond-like carbon (henceforth referred to as "DLC") and is also referred to as hydrogenated amorphous carbon (a-C:H), i-carbon, diamond-like carbon and the like. Amorphous carbon is referred to in several ways as mentioned above, but the basic structure of amorphous carbon is a mixture of carbon forms in which carbon atoms are linked using diamond bonds (sp3 bonds) and graphite bonds (sp2 bonds). The material has hardness, wear resistance, thermal conductivity and chemical stability similar to those of diamond and is further characterized by a solid lubricating property similar to that of graphite. Due to these characteristics, DLC is utilized, for example, as a slide member in automotive parts and the like as well as in protective films for metal mold, cutting tools, mechanical parts and optical parts.

A CVD method in which a hydrocarbon gas is used as the source material and an amorphous carbon film is formed using a plasma excited by direct current, radio frequency electrical power, and a PVD method such as a sputtering, arc ion plating method and the like using graphite as the cathode material may be cited as methods used to form a film comprising such an amorphous carbon. In the CVD method, in which a hydrocarbon gas is used as the source material, from about 20 at % to 40 at % of hydrogen is contained in the amorphous carbon film, but an amorphous carbon film substantially consists only of carbon that contains almost no hydrogen can be formed using a PVD method such as ion plating methods and the like using a vacuum arc discharge. Such an amorphous carbon film that contains almost no hydrogen contains a large proportion of diamond bonds (sp3 bonds), is very hard and has excellent wear resistance.

However, conventional amorphous carbon films had a peeling problem caused by poor adhesion due to the high compression stress generated at the time the films were formed. The problem was particularly serious in amorphous carbon films that contained no hydrogen, and a film thicker than 1 μm was difficult to form. The techniques used to improve adhesion between substrates and films can be roughly divided into (1) methods that relax internal stress in amorphous carbon films and (2) methods that try to relieve the stress by forming intermediate interlayers having properties that lie between the substrates and the amorphous carbon films.

As the method described in aforementioned (1), a method in which the film hardness was improved going from the substrate surface side to the film surface side to relax the residual stress to improve adhesion to a substrate was disclosed. (For examples, see Japanese Unexamined Patent Application Publication No. H05-202477, No. H01-294867, No. H05-117856.) In addition, a method that improves adhesion to a substrate by reducing the compression stress generated in the film by adding a metallic element such as W, Si and the like to the amorphous carbon film formed is also known.

As the method described in aforementioned (2), methods in which an intermediate layer of metal, metal carbide, metal nitride and the like was formed were disclosed. (For examples, see Japanese Unexamined Patent Application Publication No. S63-262467, No. S63-286576, H01-79371.) In addition, a method in which an intermediate layer composed of a metal-carbon mixed layer (using ion mixing and the like) was also proposed. Furthermore, a technology using an intermediate gradient layer in which the metal-carbon composition is changed in the depth direction was proposed. (For example, see Japanese Unexamined Patent Application Publication No. S63-286334.)

PROBLEMS TO BE SOLVED BY THE INVENTION

However, the conventional technology described above has the following problems. First of all, the effect of improving the film adhesion by suppressing peeling at the interface with the substrate is not sufficient in the method described in (1).

In addition, the coating process becomes more complex due to the complicated structure of the intermediate layer, and stable adhesion is difficult to secure and maintain in the method described in (2).

The object of the present invention is to provide an amorphous carbon film substantially consists only of carbon containing almost no hydrogen wherein the film has excellent substrate adhesion, hardness and wear resistance.

SUMMARY OF THE INVENTION

The inventors studied amorphous carbon films that had multi-layer structures with different densities in the direction of depth or had structures with continuously changing density in the direction of depth. However, the density was difficult to measure in films that were multi-layer structures or films in which the density changed continuously. However, the inventors noticed that film densities could be measured by the brightness of the TEM (transmission electron microscope) images of film cross-sections.

That is, A first aspect in accordance with the present invention provides an amorphous carbon film comprising a first amorphous carbon layer substantially consists only of carbon formed on a substrate surface and a second amorphous carbon layer substantially consists of carbon only formed on the surface of the first amorphous carbon layer, wherein the transmission electron microscope image of the first amorphous carbon layer is brighter than the transmission electron microscope image of the second amorphous carbon layer when the cross section is observed.

Here "substantially consists only of carbon" refers to a film with a hydrogen concentration according to an HFS (hydrogen forward scattering) analysis of 5 atom % or less with the balance substantially consists only of carbon. The fact that the balance substantially consists only of carbon is clearly due to the fact that DLC in the present invention is preferably formed by a PVD method using a carbon target and the film is substantially composed only of carbon.

The density of the first amorphous carbon layer is preferably lower than that of the second amorphous carbon layer. In addition, the thickness of the first amorphous carbon layer is preferably at least 5 nm and 70 nm or less. The thickness of the second amorphous carbon layer is preferably at least 0.5 μm and 5.0 μm or less.

When the thickness of the first amorphous carbon layer is less than 5 nm, the potential for the adhesion effect with the substrate to improve is insufficient. When the thickness exceeds 70 nm, the potential exists for the film strength of the layer to decline and for peeling to occur inside the layer. A thickness of the first amorphous carbon layer of from 10 nm to 65 nm is more preferred.

When the thickness of the second amorphous carbon layer is less than 0.5 μm, the potential exists for the wear resistance of the film of the present invention is not sufficient when it is used in slide member. When the thickness exceeds 5.0 μm, the potential exists for peeling from the interior of the second amorphous carbon layer. A thickness of the first amorphous carbon layer of from 0.5 μm to 2.5 μm is more preferred.

A second aspect in accordance with the present invention provides an amorphous carbon film substantially consists only of carbon formed on a substrate surface, wherein the transmission electron microscope image when observed by the cross section continuously becoming darker from the interface with the substrate to the film surface.

The density of the amorphous carbon film continuously increasing from the interface with the substrate to the film surface is preferred.

The amorphous carbon film of the present invention adheres well to substrates and also is very hard and has excellent wear resistance. The present invention can be preferably utilized in, for example, the sliding portion of automotive parts (for example, piston rings, valve lifters, cams and the like) requiring excellent reliability and in other slide members.

DESCRIPTION OF THE PREFERRED EMBODIMENTS

Preferred embodiments of the present invention are explained specifically with references to the accompanying figures.

<First Aspect of the Present Invention>

Figure 1:
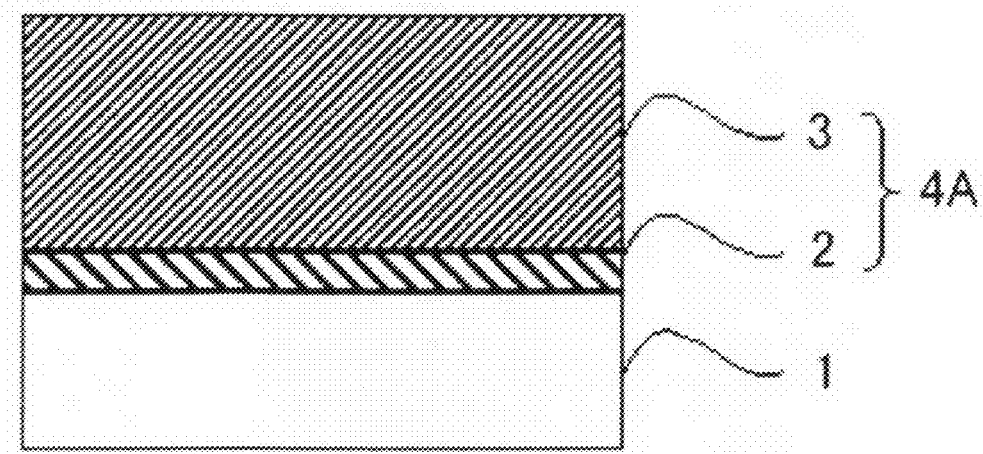
FIG. 1 is a schematic diagram showing one example of a cross sectional structure of an amorphous carbon film of the first aspect of the present invention.

FIG. 1 is a cross sectional schematic diagram of an embodiment of an amorphous carbon film of the first aspect of the present invention. In FIG. 1, the first amorphous carbon layer 2 is formed on the surface of a substrate 1, and the second amorphous carbon layer 3 is formed on the surface of the first amorphous carbon layer 2. The individual amorphous carbon layers 1 and 2 each substantially consists only of carbon and configure as a whole the amorphous carbon film 4A.

Here, the term "substantially consists only of carbon" has the significance already specified. In addition, the amorphous carbon can be confirmed using a Raman spectrum obtained using a Raman spectrophotometer (Ar laser).

When the cross section of an amorphous carbon film 4A of the first aspect of the present invention is observed, the transmission electron microscope image of the first amorphous carbon layer 2 is brighter than the transmission electron microscope image of the second amorphous carbon layer 3. This observation is explained using FIG. 2.

Figure 2:
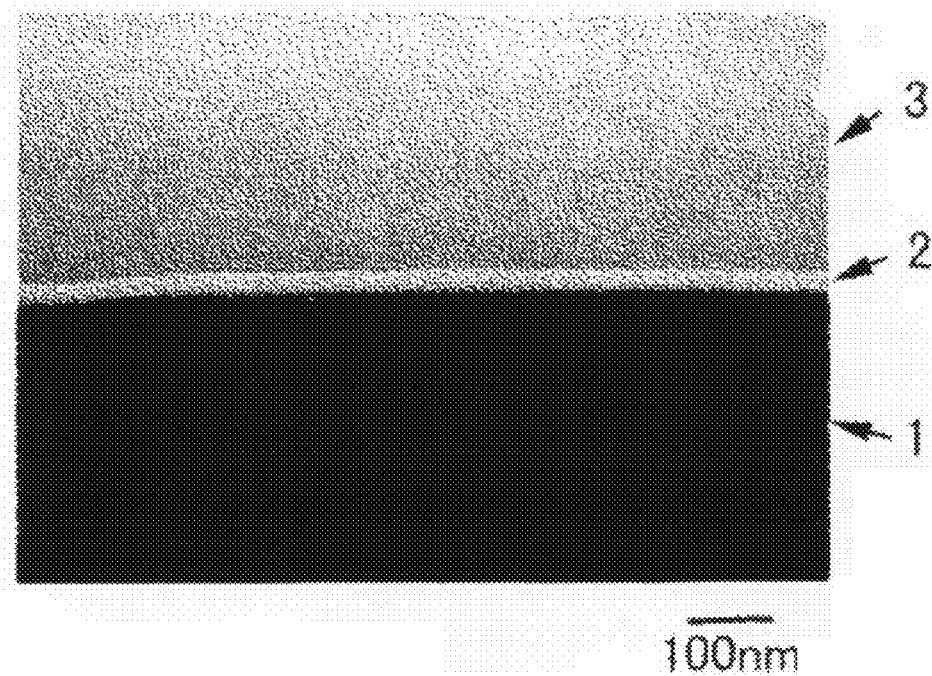
FIG. 2 shows a TEM (transmission microscope) image of the cross section of an amorphous carbon film from Example 1-15.

FIG. 2 shows a TEM (transmission microscope) image of the cross section of an amorphous carbon film that is an embodiment of the first aspect of the present invention. The symbols used in FIG. 2 are identical to those used in FIG. 1.

Ordinarily, the density of an amorphous carbon film can be measured using a GIXA method (a glancing incidence X ray analysis) or a GIXR method (a grazing incidence X ray reflectivity measurement method). However, the density of individual layers is difficult to measure using above-mentioned methods with high precision in a multi-layered structure such as the amorphous carbon film of the present invention.

Therefore, the inventors focused on the brightness of the TEM (transmission electron microscope) image of a film cross section. That is, the amount of electron beam transmitted increases as the density decreases, and the TEM image of a substance with the same composition become brighter (whiter) as the density decreases. Therefore, the densities of the individual layers in a multi-layered amorphous carbon film with identical compositions can be evaluated and controlled.

In FIG. 2, the TEM image of the first amorphous carbon layer 2 is brighter than that of the second amorphous carbon layer 3. Therefore, the density of the first amorphous carbon layer 2 is lower than that of the second amorphous carbon layer 3 in this embodiment.

The residual stress in a film itself can be lowered by lowering the density of the amorphous carbon layer. In addition, the substrate temperature rises due to ion collision when the bias voltage is raised in cases in which a film is formed using PVD. Therefore, the residual stress in a film is moderated by a thermal effect and the adhesion to a substrate can be improved.

Now, the brightness of a TEM image can be optionally selected during a measurement, but the difference between the brightness of amorphous carbon layers 2 and 3 can easily be evaluated visually. Therefore, the difference between the densities of layers 2 and 3 can be confirmed.

Now, the densities of individual amorphous carbon layers 2 and 3 can be measured using a GIXA method (a glancing incidence X ray analysis) or a GIXR method (a grazing incidence X ray reflectivity measurement method) after forming single layers thereof. According to these methods, the actual density of the first amorphous carbon layer was from 1.8 g/cm$^3$ to 2.2 g/cm$^3$, and the density of the second amorphous carbon layer is from 2.5 g/cm$^3$ to 3.5 g/cm$^3$.

Based on the above observations, a value of the ratio represented by (density of the second amorphous carbon layer)/(density of the first amorphous carbon layer) of from 1.14 to 1.94 is preferred.

Now, another amorphous carbon layer may be positioned between the first and second amorphous carbon layers in the present invention. However, the properties of the another amorphous carbon layer are similar to those of the second amorphous carbon layer, and a layer having a darker TEM image than that of the first amorphous carbon layer (the layer nearest to the substrate side) can be considered a second amorphous carbon layer (or another amorphous carbon layer of similar properties).

For example, layers having stepwise or continuously higher film densities toward the surface layer are formed by lowering the bias voltage stepwise (or continuously) during the formation of the second amorphous carbon layer after the first amorphous carbon layer is formed. This layer becomes the second amorphous carbon layer (or another similar amorphous carbon layer). In addition, the TEM images of the layers above the first amorphous carbon layer at this time become darker stepwise (or continuously) toward the surface, and the changes can be detected visually.

(Film Manufacturing Method)

The amorphous carbon layer of the first aspect of the present invention, for example, can be manufactured using a PVD method such as ion plating and the like. The PVD method can form an amorphous carbon layer that contains almost no hydrogen and yields, as stated above, a very hard film with excellent wear resistance.

The bias voltage applied to a substrate is set high when forming the first amorphous carbon layer by an ion plating method using vacuum arc discharges. The kinetic energy of the carbon ion collided to a substrate is greater when the bias voltage is high, and the carbon is deflected from the film surface by sputtering without depositing on the substrate surface. Therefore, the film formed has low density due to an amorphous and coarse texture. In addition, the substrate temperature rises due to high-energy carbon ion irradiation when the bias voltage is raised, the residual stress in the film is moderated, and the adhesion between substrate and film is improved.

A second amorphous carbon layer with high density can be formed by setting the bias voltage applied on the substrate low after the first amorphous carbon layer is formed.

<Second Aspect of the Present Invention>

Figure 3:
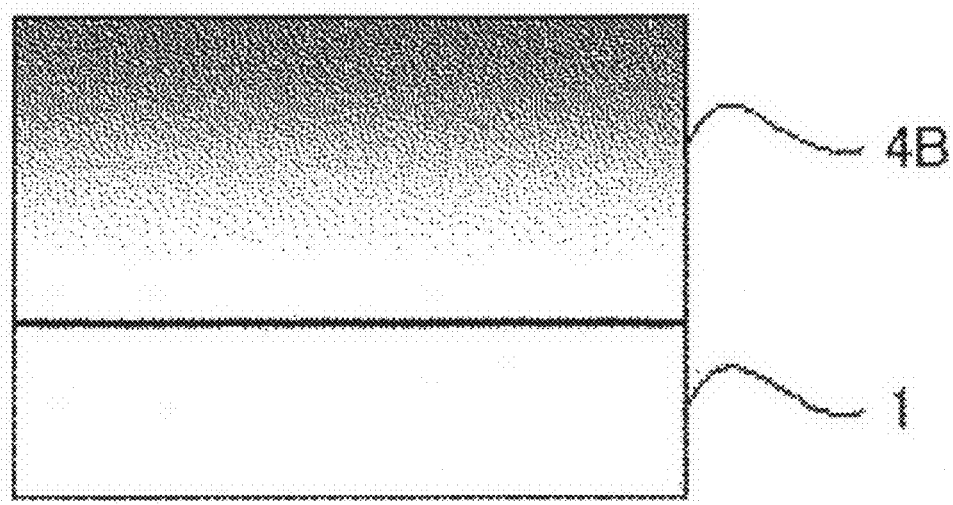
FIG. 3 is a schematic diagram showing one example of a cross sectional structure in an amorphous carbon film of the second aspect of the present invention.

FIG. 3 is a schematic diagram of a TEM image of a cross section of an embodiment of the amorphous carbon film of the second aspect of the present invention. In FIG. 3, amorphous carbon film 4B substantially consists only of carbon is formed on the surface of substrate 1. Here, the term "substantially consists only of carbon" has the same significance as previously specified. When observing the cross section, the TEM image of the amorphous carbon film 4B darkens continuously from the interface with substrate 1 to the film surface.

The fact that the density of the amorphous carbon film changes according to the brightness of the TEM image has been already explained. The brightness of the TEM image changes continuously in the depth direction in the second aspect of the present invention, and which indicates that the density of the amorphous carbon film continuously increases from the interface toward the film surface.

The actual density of the amorphous carbon film is intermediate to the densities of single layers of the first and second amorphous carbon films of the first aspect of the present invention described above. That is, the film density on the substrate side is from 1.8 g/cm$^3$ to 2.2 g/cm$^3$, and the density of the film surface is from 2.5 g/cm$^3$ to 3.5 g/cm$^3$.

The density of an amorphous carbon film changes continuously in the depth direction in the second aspect of the present invention, the residual stress is further moderated compared to the first aspect of the present invention, and the adhesion to the substrate is excellent.

Now, the thickness of the amorphous carbon film of the second aspect of the present invention can be the same as the thickness of the second amorphous carbon film of the first aspect of the present invention.

(Film Manufacturing Method)

The method used to manufacture an amorphous carbon film of the second aspect of the present invention may be the same method used for the first aspect of the present invention. However, the bias voltage applied to a substrate is, for example, set as follows when the film is formed using an ion plating method with vacuum arc discharge. First, the bias voltage is set high initially when starting to form a film, and a low density film is formed on the substrate. The bias voltage is subsequently lowered continuously with the film formation progressing to form an amorphous carbon film with changing density in the depth direction (gradient density).

Figure 4:
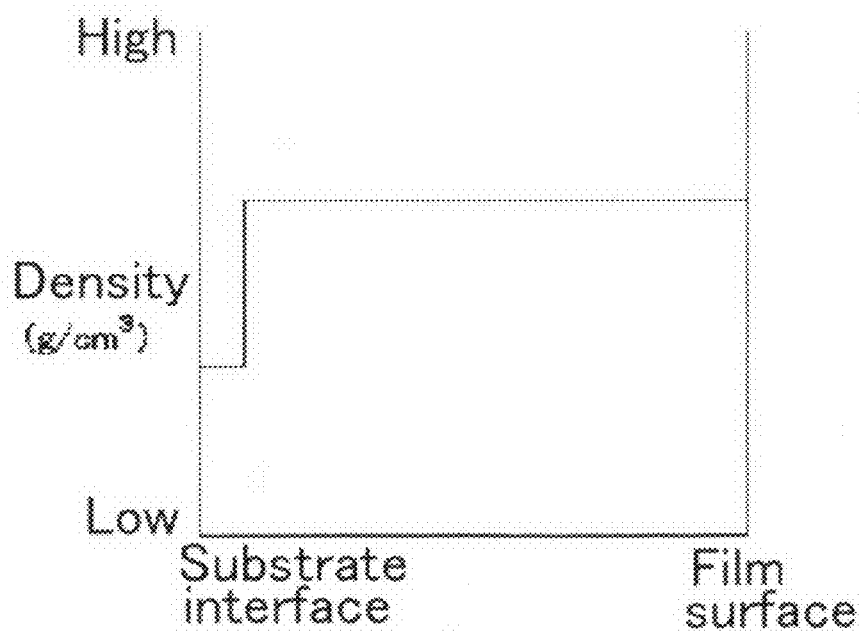
FIG. 4 is a graph showing the density change in the depth direction in an amorphous carbon film of the first aspect of the present invention.

FIG. 4 is a graph showing the density change in the depth direction in an amorphous carbon film of the first aspect of the present invention. In this figure, the density changes non-continuously in the first amorphous carbon layer positioned on the substrate interface side and the second amorphous carbon layer on the film surface side.

Figure 5:
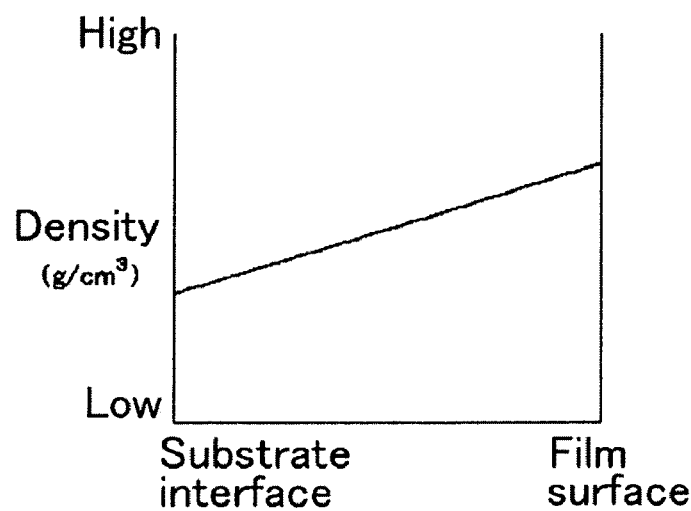
FIG. 5 is a graph showing the density change in the depth direction in an amorphous carbon film of the second aspect of the present invention.

On the other hand, FIG. 5 is a graph indicating the density change in the depth direction of an amorphous carbon film of the second aspect of the present invention. In this figure, the density changes continuously from the substrate interface side to the film surface.

EXAMPLES

The examples of the present invention are explained in further detail below, but the present invention is not limited to these examples.

Example 1

A cemented carbide [a cemented carbide containing WC (tungsten carbide) as the main component and Co as the binding material] and an iron type alloy (SUS440C, SCM420 carburized material, SKD11, SKH51, these are Japanese Industrial Standards) for slide member were used according to the data presented in Table 1 to form substrates.

Figure 6:
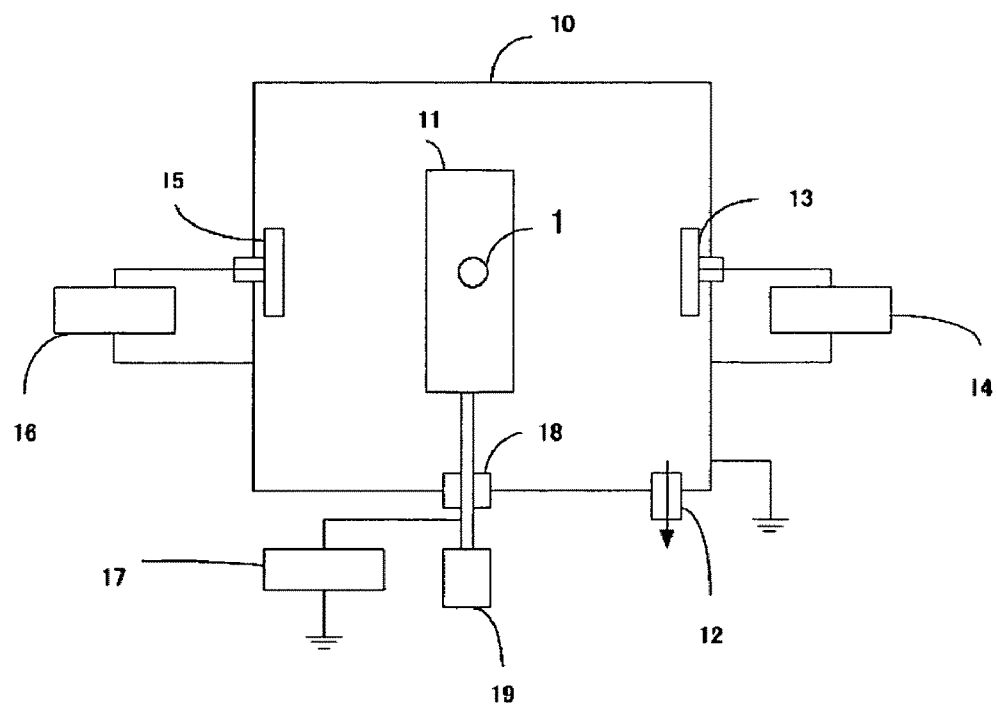
FIG. 6 is a schematic diagram showing the constitution of a coating apparatus used in an arc ion plating method.

Amorphous carbon films were formed on the individual substrates described above using the coating apparatus shown in FIG. 6 using an ion plating method with a vacuum arc vaporization source. The coating apparatus was equipped with a vacuum chamber 10, and arc vaporization sources 13 and 15, and a substrate holder 11, were positioned inside the vacuum chamber 10.

A film was formed as follows. First a substrate 1 was ultrasonically cleaned in a cleaning solution (acetone or isopropyl alcohol) and was subsequently positioned in a substrate holder 11. Next a designated degree of vacuum was achieved inside the vacuum chamber using the vacuum pump (not show in the figure) connected to an exhaust port 12 located in the vacuum chamber 10, and the surface of the substrate was subsequently cleaned using an ion bombardment treatment. An inert gas (Ar or He) was used for the ion bombardment treatment used to clean the substrate surface. Ti or Cr was used for the ion bombardment treatment of certain samples.

Next a constant current from an electrical arc source 16 was applied to a vaporization source 15 equipped with a carbon cathode, and an amorphous carbon film was formed on the substrate 1. The substrate holder 11 was rotated during the film forming process using a motor 19 around a rotation feed-through 18 as an axis. In addition, a D C bias voltage was applied to the substrate 1 from the substrate holder 11, through D C electrical source 17 connected to the rotation feed-through 18.

The D C bias voltage was set at from 500V to 1000V from initiation of film formation until a designated time elapsed. The voltage was used to cause high energy carbon ion to collide with the substrate 1 to form a low density first amorphous carbon layer 2.

The bias voltage was subsequently set at from 50V to 100V, a level lower than that used to form the first amorphous carbon layer, to lower the collision energy of the carbon ions on the substrate to form a higher density second amorphous carbon layer 3 over layer 2.

The film thicknesses of the first and second amorphous carbon layers and the bias voltage used while forming the films are shown in Table 1 when various substrates were used. (Examples 1-1 to 1-19.) Now, in the table, "AIP" refers to the fact that the film was formed according to the ion plating method described above using a vacuum arc discharge type vaporization source.

Comparative Examples 1-1 and 1-2

A film was formed in Comparative Example 1-1 using a process identical to that used in Examples 1-1 to 1-19 with the exception that the first amorphous carbon layer 2 was not formed on the substrate and only the second high density amorphous carbon layer 3 was formed on the substrate to a film thickness of 0.8 μm using a bias voltage setting of 80V.

In addition, a film was formed in Comparative Example 1-2 using a process identical to that used in Examples 1-1 to 1-19 with the exception that the high density first amorphous carbon layer 2 was formed on the substrate and the low density second amorphous carbon layer 3 was formed over layer 2 with a bias voltage setting of 1000V.

(Evaluation)

1. Density of an Amorphous Carbon Layer.

The first amorphous carbon layer 2 described above was differentiated from the second amorphous carbon layer 3 by visually examining the brightness of the TEM image. The layer with a brighter TEM image was confirmed to be the "low density" first amorphous carbon layer, and the layer with a darker TEM image was confirmed to be the "high density" second amorphous carbon layer.

In addition, an HFS analysis of the first amorphous carbon layer 2 and the second amorphous carbon layer 3 confirmed the fact that the entire film did not contain hydrogen (5 atom % or less).

2. Thickness of the Amorphous Carbon Layers.

The thickness of the first amorphous carbon layer was calculated using a TEM (transmission electron microscope) to examine layer cross sections in individual examples and comparative examples. In addition, the thickness of the second amorphous carbon layer was calculated using CALOTEST (the ball crater test) (simplified film thickness measuring method).

3. Adhesion.

The adhesion strength of the outermost surface in individual examples and comparative examples was evaluated according to the following standards upon examining indentations on the films after conducting Rockwell indentation tests [indenter: Rockwell C scale, pressing load: 1470N (150 kgf)] at five locations. The adhesion was considered good when the evaluation was ⊙, ○ or Δ.

⊙: No defect was observed in any of the test indentations.
○: A slight defect was observed in one of the test locations.
Δ: Slight defects were observed in at least two of the test locations.
X: Defects such as peeling and the like were observed in the film.

Now, the outermost surface (the second amorphous carbon layer) of the films in individual examples was formed using a PVD method and was an amorphous carbon film containing almost no hydrogen with a high ratio of diamond bonds (sp3 bonds) and excellent wear resistance.

TABLE 1

| | First amorphous carbon layer | | | Second amorphous carbon layer | | | | |
|---|---|---|---|---|---|---|---|---|
| | Film forming method | Bias voltage (V) | Film thickness (nm) | Film forming method | Bias voltage (v) | Film thickness (μm) | Substrate | Adhesion |
| Example 1-1 | AIP | 500 | 4 | AIP | 100 | 1.2 | SKH51 | Δ |
| Example 1-2 | AIP | 500 | 20 | AIP | 80 | 0.5 | cemented carbide | ⊙ |
| Example 1-3 | AIP | 500 | 24 | AIP | 80 | 0.8 | SCM420 carburized material | ⊙ |
| Example 1-4 | AIP | 500 | 41 | AIP | 50 | 2.9 | SKD11 | ○ |
| Example 1-5 | AIP | 500 | 55 | AIP | 50 | 5.3 | SKH51 | Δ |
| Example 1-6 | AIP | 500 | 62 | AIP | 100 | 2.4 | SKH51 | ⊙ |
| Example 1-7 | AIP | 750 | 8 | AIP | 80 | 2.0 | SKH51 | ○ |
| Example 1-8 | AIP | 750 | 12 | AIP | 100 | 1.8 | SKH51 | ⊙ |
| Example 1-9 | AIP | 750 | 33 | AIP | 50 | 4.9 | SCM420 carburized material | ○ |
| Example 1-10 | AIP | 750 | 50 | AIP | 100 | 2.6 | cemented carbide | ○ |
| Example 1-11 | AIP | 750 | 64 | AIP | 50 | 1.8 | SKD11 | ⊙ |
| Example 1-12 | AIP | 750 | 72 | AIP | 80 | 1.1 | SKH51 | Δ |
| Example 1-13 | AIP | 1000 | 5 | AIP | 80 | 0.8 | SKH51 | ○ |
| Example 1-14 | AIP | 1000 | 15 | AIP | 50 | 2.4 | SKH51 | ⊙ |
| Example 1-15 | AIP | 1000 | 28 | AIP | 80 | 1.0 | SKH51 | ⊙ |
| Example 1-16 | AIP | 1000 | 40 | AIP | 80 | 0.8 | SKD11 | ⊙ |
| Example 1-17 | AIP | 1000 | 64 | AIP | 80 | 0.6 | SUS440C | ⊙ |
| Example 1-18 | AIP | 1000 | 70 | AIP | 80 | 0.9 | SKH51 | ○ |
| Example 1-19 | AIP | 1000 | 75 | AIP | 80 | 0.9 | SCM420 carburized material | Δ |
| Comparative Example 1-1 | — | — | — | AIP | 80 | 0.8 | cemented carbide | X |
| Comparative Example 1-2 | AIP | 80 | 50 | AIP | 1000 | 0.5 | cemented carbide | X |

As clearly indicated by the data reported in Table 1, the amorphous carbon films of individual Examples 1-1 to 1-19 all exhibited excellent adhesion strength.

The examples in which the first amorphous carbon layers were from 5 nm to 70 nm thick were particularly good with adhesion strength evaluated to be ○ or ⊙. The adhesion strength experienced a slight decline in Examples 1-5 due to the thickness of the second amorphous carbon layer exceeding 5.0 μm to generate a higher internal compression stress in the film.

On the other hand, enough adhesion strength was not gained in both cases when a low density first amorphous carbon layer was not formed on the substrate in Comparative Example 1-1 and when a low density amorphous carbon layer was formed after a high density amorphous carbon layer was formed on the substrate in Comparative Example 1-2.

Example 2

A film was formed on a substrate in the same manner as in Example 1. However, the D C bias voltage was continuously changed as follows in Example 2 while the film was forming. First, the bias voltage was set at 500V or 1000V when initiating film formation, and the film formation was completed after subsequently lowering the voltage continuously to 100V. The samples obtained were labeled Examples 2-1 to 2-5.

The brightness of TEM images were visually evaluated for the films described above. The TEM images continuously darkened from the substrate side to the surface, and the film densities of the amorphous carbon films were confirmed to increase continuously from the substrate side.

In addition, HFS analyses were conducted on the films, and each of the entire films was confirmed to not contain hydrogen (5 atom % or less).

Comparative Examples 2-1 and 2-2

The films of Comparative Examples 2-1 and 2-2 were prepared in exactly the same manner the films were prepared in Examples 2-1 to 2-5 with the exception that the bias voltage was set at a constant 100V and only a high density amorphous carbon layer 3 with a 0.8 μm film thickness was formed on the substrate.

When using a bias voltage of about 100V the DLC film was formed from carbon ions with low collision energy on the substrate, and a high density amorphous carbon layer 3 was formed.

The products from individual examples and comparative examples were evaluated in exactly the same manner as in Example 1.

The results obtained are shown in Table 2.

TABLE 2

| | Initiation film forming Bias voltage (v) | Film forming completion Bias voltage (v) | Film thickness (μm) | Substrate | Adhesion strength |
|---|---|---|---|---|---|
| Example 2-1 | 500 | 100 | 0.7 | cemented carbide | ⊙ |
| Example 2-2 | 500 | 100 | 0.9 | SCM420 carburized material | ⊙ |
| Example 2-3 | 1000 | 100 | 0.8 | SUS440C | ⊙ |
| Example 2-4 | 1000 | 100 | 1 | SKD11 | ⊙ |
| Example 2-5 | 1000 | 100 | 0.9 | SKH51 | ⊙ |
| Comparative Example 2-1 | 100 | 100 | 0.8 | cemented carbide | X |
| Comparative Example 2-2 | 100 | 100 | 0.8 | SCM420 carburized material | X |

As clearly indicated by the data in Table 2, the amorphous carbon film of individual examples 2-1 through 2-5 all had the best adhesion strength.

On the other hand, the adhesion strength deteriorated in Comparative Examples 2-1 and 2-2 when only a high density amorphous carbon film was formed on the substrate.

What is claimed is:

1. An amorphous hard carbon film formed on a substrate surface, wherein the substrate comprises a slide member and the film comprises: a first amorphous carbon layer having a thickness of between at least 5 nm and 70 nm or less and substantially consisting only of carbon formed on the substrate surface; and a second amorphous carbon layer having a thickness of between at least 0.5 μm and 5.0 μm or less and substantially consisting only of carbon formed on the outermost surface of the first amorphous carbon layer, wherein the transmission electron microscope image of the first amorphous carbon layer is brighter than the transmission electron microscope image of the second amorphous carbon layer when the cross section is observed and wherein the density of the first amorphous carbon layer is lower than the density of the second amorphous carbon layer.

2. The amorphous hard carbon film of claim 1, wherein the transmission electron microscope image when observed by the cross section continuously becomes darker from the interface with the substrate to the film surface.

3. The amorphous hard carbon film described in claim 2, wherein the density of the amorphous carbon film continuously increases from the interface with the substrate to the film surface.

4. The amorphous hard carbon film of claim 1, wherein the first amorphous carbon layer and the second amorphous carbon layer are formed using PVD with the bias voltage being set at 500V or 1000V when initiating film formation and wherein the film formation is completed after lowering the bias voltage continuously to 100V.

5. The amorphous hard carbon film of claim 1, wherein the density of the first amorphous carbon layer is between 1.8 g/cm$^3$ and 2.2 g/cm$^3$, and the density of the second amorphous carbon layer is between 2.5 g/cm$^3$ and 3.5 g/cm$^3$.

* * * * *